(12) United States Patent
Fujita

(10) Patent No.: US 6,947,318 B1
(45) Date of Patent: Sep. 20, 2005

(54) MAGNETIC RANDOM ACCESS MEMORY

(75) Inventor: Katsuyuki Fujita, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 135 days.

(21) Appl. No.: 10/368,491

(22) Filed: Feb. 20, 2003

(30) Foreign Application Priority Data

Sep. 25, 2002 (JP) ........................................ 2002-279743

(51) Int. Cl.$^7$ .............................................. G11C 11/15
(52) U.S. Cl. ............. 365/173; 365/189.05; 365/189.08; 365/225.5
(58) Field of Search ............................ 365/173, 185.05, 365/185.08, 225.5, 189.05, 189.08

(56) References Cited

U.S. PATENT DOCUMENTS

| | | | |
|---|---|---|---|
| 6,175,525 B1 | 1/2001 | Fulkerson et al. | ..... 365/189.05 |
| 6,643,195 B2 * | 11/2003 | Eldredge et al. | ............ 365/200 |
| 6,687,179 B2 * | 2/2004 | Baker | ...................... 365/225.5 |

* cited by examiner

Primary Examiner—Van Thu Nguyen
Assistant Examiner—Pho M. Luu
(74) Attorney, Agent, or Firm—Oblon, Spivak, McClelland, Maier & Neustadt, P.C.

(57) ABSTRACT

An information storage portion which stores tuning information is constituted by a plurality of magnetic elements & latch circuits. Each of the magnetic elements & latch circuits has two magneto-resistive effect elements, and the tuning information is stored in these elements. Complementary data are stored in the two magneto-resistive effect elements. After turning on a power supply, a power-on detection circuit outputs a transfer signal and a latch signal. When the transfer signal becomes "H", the tuning information is transferred to the latch circuit. When the latch signal becomes "H", the tuning information is latched to the latch circuit and supplied to the internal circuit.

15 Claims, 7 Drawing Sheets

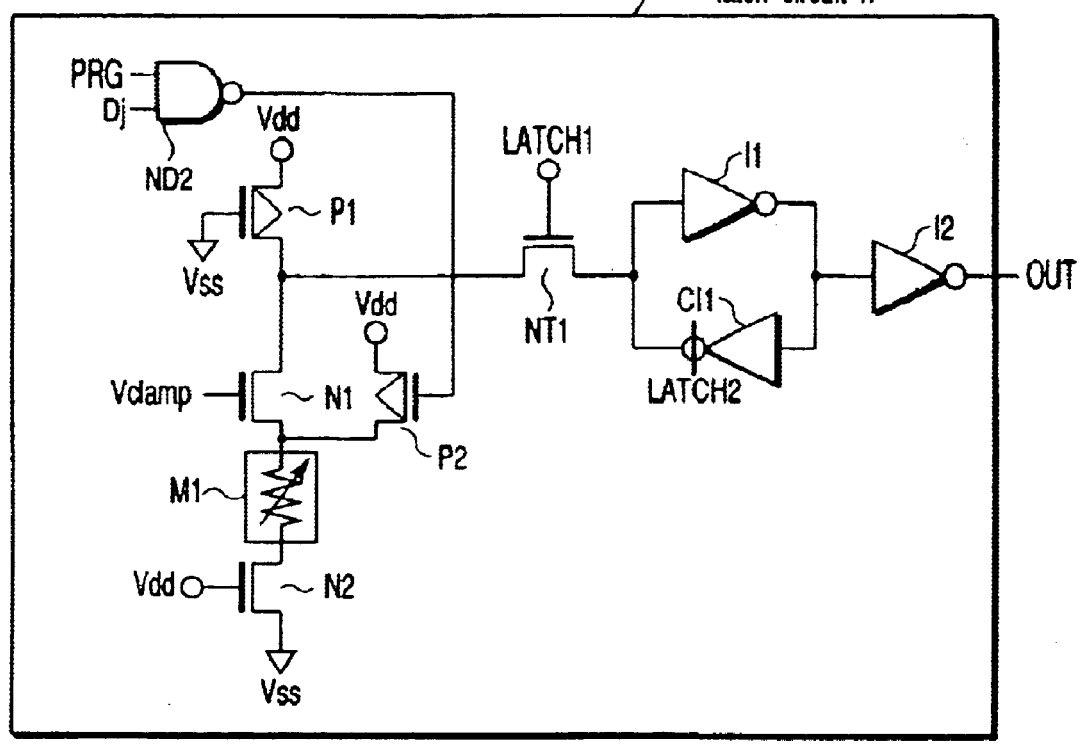
F I G. 15

MAGNETIC RANDOM ACCESS MEMORY

CROSS-REFERENCE TO RELATED APPLICATIONS

This application is based upon and claims the benefit of priority from the prior Japanese Patent Application No. 2002-279743, filed Sep. 25, 2002, the entire contents of which are incorporated herein by reference.

BACKGROUND OF THE INVENTION

1. Field of the Invention

The present invention relates to a magnetic random access memory (MRAM) using a magneto-resistive effect element as a storage element.

2. Description of the Related Art

In recent years, research and development of a magnetic random access memory which stores data in a non-volatile manner by utilizing a magneto-resistive effect have been frequently carried out. One of characteristics of the magnetic random access memory lies in that realization of a finer element and higher integration is possible.

However, when realization of the finer element and higher integration advances, irregularities in the operation characteristic of an internal circuit caused due to shifting of a pattern or irregularities in an element shape in manufacture become large.

Therefore, in the magnetic random access memory, the operation characteristic of the internal circuit is inspected, and irregularities in the operation characteristic are confirmed. Thereafter, based on the irregularities, conditions for reducing the irregularities in the operation characteristic of the internal circuit, i.e., tuning information is programmed in an information storage portion in a chip.

It is to be noted that the tuning information is read from an information storage portion when turning the power supply and operation conditions of the internal circuit, e.g., a value of an internal power supply potential (DC potential), a value of write current, a value of a reference current in a sense amplifier, a sense timing or the like are determined based on the tuning information.

In the conventional magnetic random access memory, trimming information for adjusting the operation characteristic of the internal circuit, redundancy information for substituting a defective cell by a redundant cell, ID information of the magnetic random access memory and others are programmed in a fuse element.

As a method for programming the information in the fuse element, there are a method for cutting the fuse element by using a laser and a method for electrically disconnecting the fuse by an excessive current or an excessive voltage (E-FUSE).

In case of the method for cutting the fuse element by using the laser, since the fuse can not be cut after packaging, the tuning information must be of course programmed in the fuse element in the wafer state before packaging. Therefore, this method can perform only adjustment of the internal circuit by which the operation characteristic test can be conducted.

In case of the method for disconnecting the fuse element by using an excessive current, the fuse element is blown out by giving the excessive current to the fuse element from an external element of the package. Further, in case of the method using an excessive voltage, dielectric breakdown is caused by giving an excessive voltage to the fuse element from the external element of the package, thereby storing the information in the fuse element.

However, in case of programming the information in the fuse element, which includes the method for electrically disconnecting the fuse element by using the excessive current or the excessive voltage, when the information is once programmed in the fuse element, there is a problem that re-programming is impossible.

Meanwhile, in the magnetic random access memory, the memory cell stores data in the non-volatile manner, and data in the memory cell can be electrically rewritten many times. Therefore, the tuning information can be programmed in a part of the memory cells in the memory cell array.

In this case, however, a write/read circuit for writing/reading data must be usually utilized in order to write/read the tuning information. Thus, the write/read circuit itself must be designed/manufactured in such a manner that it can constantly correctly operate irrespective of the turning information.

In other words, as to the characteristic of the write/read circuit, since adjustment can not be carried out based on the tuning information, there may occur a possibility that the tuning information which must be correctly read may not be correctly read.

BRIEF SUMMARY OF THE INVENTION

A magnetic random access memory concerning an aspect of the present invention comprises: a memory cell array determining a first element having a magnetic layer as a memory cell; an internal circuit which controls a memory operation including a data write/read operation with respect to the memory cell array; and an information storage portion which is provided separately from the memory cell array and stores, in a non-volatile manner, information determining an operation characteristic of the internal circuit based on a test result of the internal circuit, the information storage portion using a second element having a magnetic layer as a storage element to store the information determining the operation characteristic of the internal circuit.

BRIEF DESCRIPTION OF THE SEVERAL VIEWS OF THE DRAWING

FIG. 6 is a block diagram showing a primary part of a magnetic-random access memory according to a second embodiment of the present invention;

FIG. 15 is a view showing a circuit example of the magnetic circuit & latch circuit illustrated in FIG. 14.

DETAILED DESCRIPTION OF THE INVENTION

A magnetic random access memory according to an aspect of the present invention will now be described in detail hereinafter with reference to the accompanying drawings.

1. First Embodiment

Figure 1:
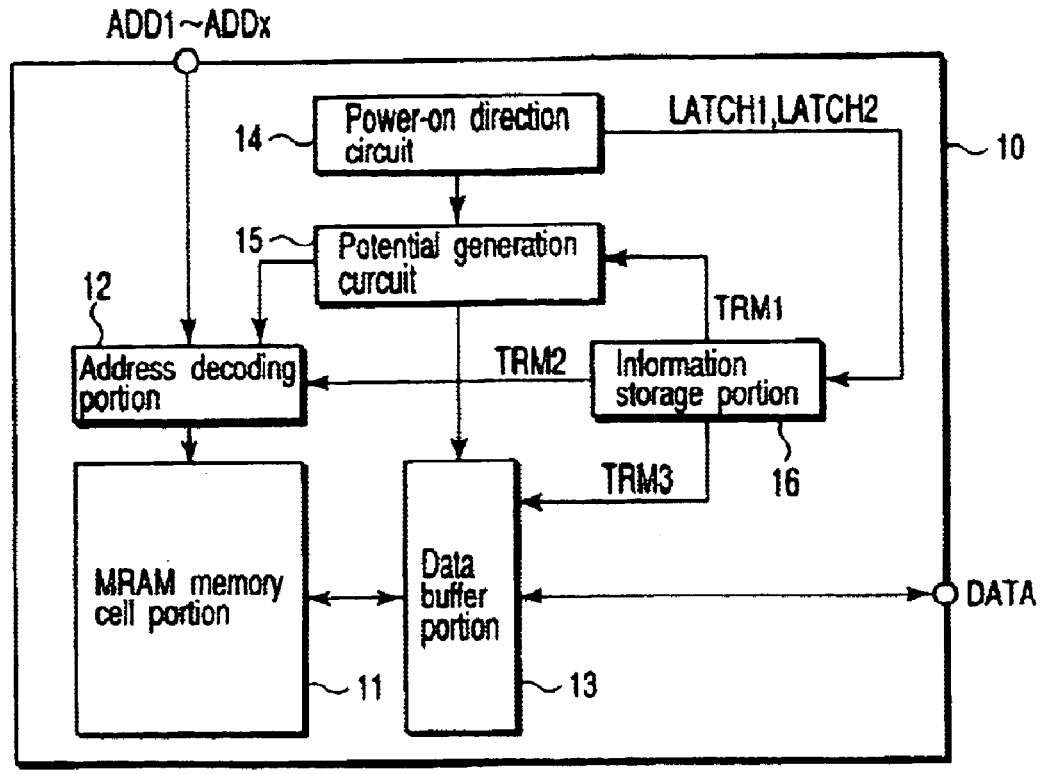
FIG. 1 is a block diagram showing a primary part of a magnetic random access memory according to a first embodiment of the present invention.

FIG. 1 is a block diagram showing a primary part of a magnetic random access memory according to a first embodiment of the present invention.

In a memory chip 10 are arranged an MRAM memory cell array 11 having a magneto-resistive effect element as a memory cell, an address decoding portion 12, a data buffer portion 13, a power-on detection circuit 14, a potential generation circuit 15 and an information storage portion 16.

The address decoding portion 12 has a function to randomly access a memory cell in the memory cell array 11 based on address signals ADD1 to ADDx upon receiving the address signals ADD1 to ADDx. The address decoding portion 12 includes a driver/sinker which drives a write/read word line in, e.g., the write/read operation.

The data buffer portion 13 has a function to determine a direction of a write current which is to be passed to a write bit line based on write data DATA upon receiving the write data DATA in, e.g., the write operation. The data buffer portion 13 includes a driver/sinker for driving the write bit line in the write operation.

Furthermore, the data buffer portion 13 has a function to sense and amplify read data DATA from the memory cell array 11 and output the read data DATA to the outside of the memory chip 10 in, e.g., the read operation. The data buffer portion 13 includes a sense amplifier for sensing and amplifying the read data DATA in the read operation.

The power-on detection circuit 14 has a function to detect that a power supply is turned on in a system including the memory chip 10 and an external power supply potential Vcc is supplied to the memory chip 10. That is, the power-on detection circuit 14 outputs a detection signal to the potential generation circuit 15 upon detecting the external power supply potential Vcc and also outputs latch signals LATCH1 and LATCH2 to the information storage portion 16.

The potential generation circuit 15 generates an internal power supply potential (DC potential) Vdd when it receives the detection signal. The internal power supply potential Vdd is supplied to, e.g., the address decoding portion 12 and the data buffer portion 13.

The information storage portion 16 has a storage element which stores trimming information for adjusting an operation characteristic of the internal circuit, redundancy information for substituting a defective cell by a redundant cell, ID information of the magnetic random access memory and others. The storage element is constituted by a magneto-resistive effect element, namely, an element whose resistance value varies in accordance with a direction of magnetization of the magnetic layer (a TMR element, a GMR element or the like).

The storage element may have the structure and the size which are substantially equal to those of the memory cell in the memory cell array 11. Moreover, top priority is given to correctly and assuredly reading the tuning information. Therefore, only the structure of the storage element may be equal to that of the memory cell in the memory cell array 11 and the size thereof may be set larger in order to suppress irregularities of the operation characteristic due to irregularities in shape during processing.

When the power supply is turned on and the information storage portion 16 receives the latch signals LATCH1 and LATCH2 outputted from the power-on detection circuit 14, it latches trimming signals TRM1, TRM2 and TRM3 stored in the storage element, and supplies the trimming signals TRM1, TRM2 and TRM3 to the internal circuit in the memory chip 10.

In this example, the trimming signal TRM1 is supplied to the potential generation circuit 15, the trimming signal TRM2 is supplied to the address decoding portion 12, and the trimming signal TRM3 is supplied to the data buffer portion 13.

The trimming signal TRM1 is, e.g., a signal used to adjust a value of the internal power supply potential Vdd in accordance with the operation characteristic of the internal circuit, and the potential generation circuit 15 determines a value of the internal power supply potential Vdd based on the trimming signal TRM1.

The trimming signal TRM2 is, e.g., a signal for adjusting a value of a write word line current and a supply/cutoff timing in accordance with an operation characteristic of the internal circuit, and the address decoding portion 12 determines a value of the write word line current and a supply/cutoff timing based on the trimming signal TRM2.

The trimming signal TRM3 is, e.g., a signal which adjusts a value of a write bit line current and a supply/cutoff timing in accordance with an operation characteristic of the internal circuit, and the data buffer portion 13 determines a value of the write bit line current and the supply/cutoff timing based on the trimming signal TRM3.

Figure 2:
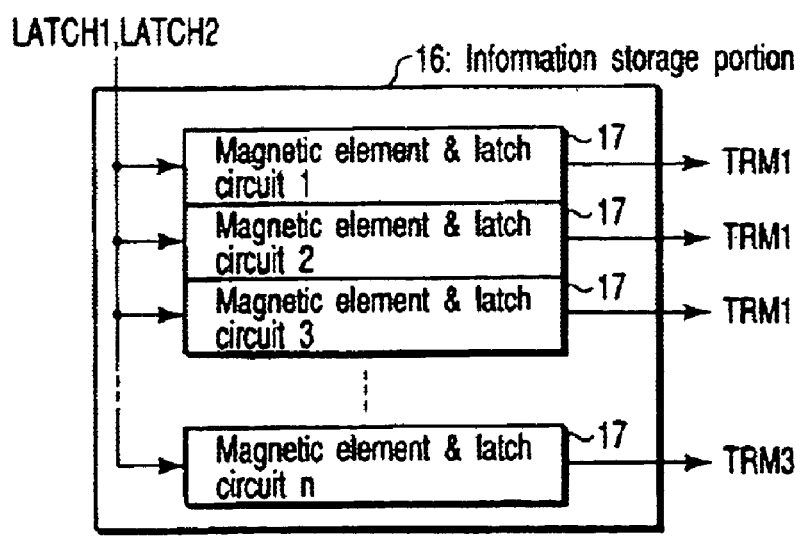
FIG. 2 is a view showing a structural example of an information storage portion illustrated in FIG.1.
Figure 3:
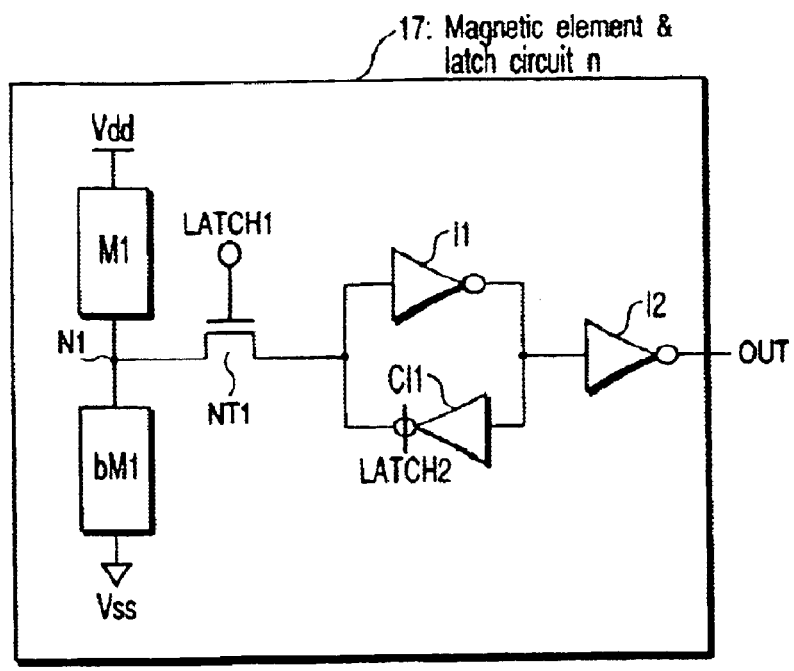
FIG. 3 is a view showing a circuit example of a magnetic element & latch circuit illustrated in FIG. 2.

FIG. 2 shows a structural example of the information storage portion 16. FIG. 3 shows a circuit example of the magnetic element & latch circuit n depicted in FIG. 2.

The information storage portion 16 is constituted by a plurality of the magnetic elements & the latch circuits 1, 2, 3, . . . n. The magnetic elements & the latch circuits 1, 2, 3, . . . n all have substantially the same circuit configuration.

It is to be noted that the trimming signals TRM1, TRM2 and TRM3 may be generated by one magnetic element & latch circuit or it may be generated by two or more magnetic elements & latch circuits.

Reference characters M1 and bM1 denote magneto-resistive effect elements (TMR elements, GMR elements or the like) whose resistance value varies in accordance with a direction of magnetization of the magnetic layer. In this example, one-bit data is stored in one magnetic element latch circuit. That is, the one-bit data is stored in two magneto-resistive effect elements M1 and bM1.

The one-bit data is stored by using two storage elements in this manner in order to correctly and assuredly read the tuning information by enabling acquisition of a larger quantity of signal than that of the memory cell in the memory cell array which stores the one-bit data by using one storage element.

It is to be noted that the size of each of the magneto-resistive effect elements (storage elements) M1 and bM1 may be set larger than that of the memory cell in the memory cell array as described above.

Figure 4:
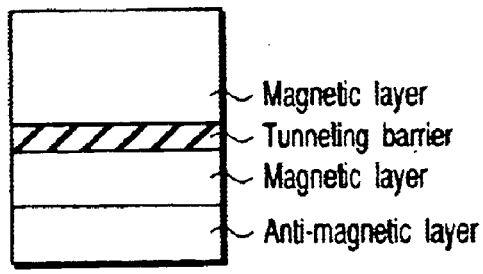
FIG. 4 is a view showing an example of a magneto-resistive effect element.

As shown in FIG. 4, each of the magneto-resistive effect elements M1 and bM1 is basically constituted by one insulation layer (tunneling barrier), two magnetic layers sandwiching this insulation layer, and an anti-magnetic layer which is in contact with one magnetic layer.

Figure 5:
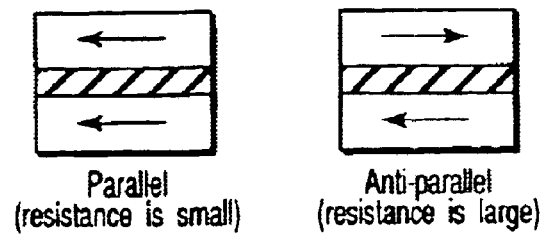
FIG. 5 is a view showing a state of the magneto-resistive effect element according to program data.

In addition, as shown in FIG. 5, the resistance value becomes lowest (for examples R−ΔR) when the directions of magnetization of the two magnetic layers of the magneto-resistive effect element are equal (parallel), and the resistance value becomes highest (for example, R+ΔR) when the directions of magnetization of the two magnetic layers of the magneto-resistive effect element are opposite to each other (anti-parallel).

In case of this example, the one-bit data is stored by setting the magnetization states of the magneto-resistive effect elements M1 and bM1 so as to be different from each other.

For example, when programming data "1" in the magnetic element & latch circuit n, the magnetization state of the magneto-resistive effect element M1 sets parallel (resistance value: R−ΔR), and the magnetization state of the magneto-resistive effect element bM1 is set anti-parallel (resistance value: R+ΔR). When programming data "0" in the magnetic element & latch circuit n, the magnetization state of the magneto-resistive effect element M1 is set anti-parallel (resistance value: R+ΔR), and the magnetization state of the magneto-resistive effect element bM1 is set to parallel (resistance value: R−ΔR).

By storing the one-bit data by using the two magneto-resistive effect elements M1 and bM1 in this manner, a difference between a quantity of signal when reading the data "1" and a quantity of signal when reading the data "0" can be set larger than that in case of storing the one-bit data by using one magneto-resistive effect element M1 or bM1.

It is to be noted that each of the magneto-resistive effect elements M1 and bM1 can be constituted by, e.g., a series resistor in which m storage elements (m is a number not less than 1) shown in FIG. 4 are connected in series. In this case, a difference between the potential of a node n1 when storing the data "1" and the potential of the node n1 when storing the data "0" is (m·ΔR)·Vdd/R. That is, a difference in quantity of signal can be made larger as m is increased.

The latch circuit is constituted by an inverter I1 and a clocked inverter CI1 which are flip-flop-connected.

An N channel MOS transistor NT1 is connected between the magneto-resistive effect elements M1 and bM1 and an input node of the latch circuit. An inverter I2 is connected to an output node of the latch circuit. An output signal OUT from the inverter I2 becomes a trimming signal TRM1.

Figure 6:
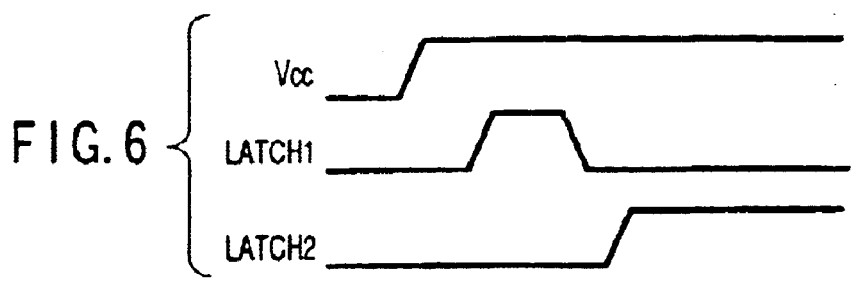
FIG. 6 is a waveform chart showing operation waveforms of the magnetic element & the latch circuit depicted in FIG. 3.

FIG. 6 shows an operation waveform of the magnetic element & latch circuit n depicted in FIG. 3.

When the power supply is turned on, the power-on detection circuit 14 (see FIG. 1) first outputs a latch signal (pulse signal) LATCH1.

When the latch signal LATCH1 is in a period "H", the node n1 is electrically connected to the latch circuit. Therefore, data programmed in the magneto-resistive effect elements M1 and bM1 is transferred to the latch circuit.

Thereafter, the power-on detection circuit 14 (see FIG. 1) turns the latch signal LATCH2 to "H". When the latch signal LATCH2 becomes "H", the data read from the magneto-resistive effect elements M1 and bM1 is latched to the latch circuit.

Figure 7:
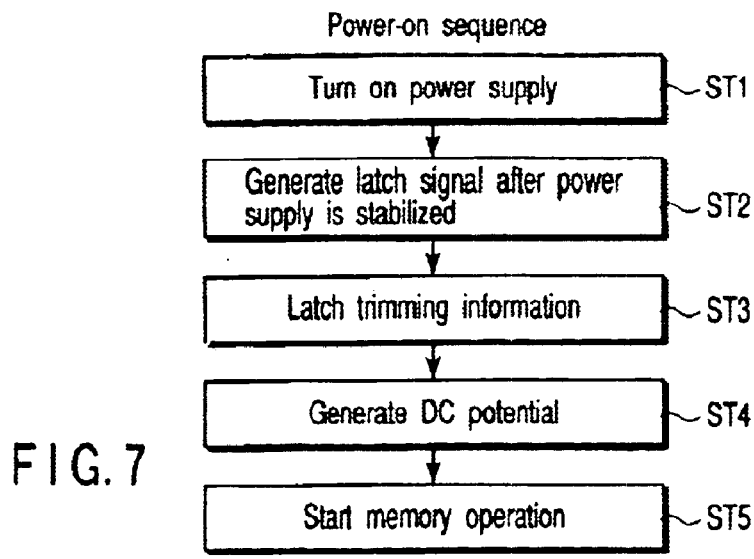
FIG. 7 is a view showing an example of a power-on sequence.

FIG. 7 shows a power-on sequence according to the present invention.

After turning on the power supply, the latch signal is generated (steps ST1 to ST2).

Upon receiving the latch signal, the latch circuit latches the trimming information and supplies this trimming information to the internal circuit (step ST3).

Thereafter, upon receiving the trimming information, the potential generation circuit generates an internal power supply potential (DC potential) Vdd (step ST4).

Then, the internal power supply potential Vdd is supplied to the internal circuit, and the memory operation is started (step ST5).

As described above, according to the first embodiment of the present invention, the magneto-resistive effect elements whose resistance value varies in accordance with a direction of magnetization of the magnetic layer is used for the programming of the tuning information. Therefore, after packaging, the tuning information can be repeatedly written.

Additionally, the magneto-resistive effect element which stores the tuning information is set to a size which is not affected by irregularities in shape, namely, a size required for correctly and assuredly reading data, for example, a size larger than that of the memory cell. Further, the one-bit data is stored by using the two magneto-resistive effect elements, and a difference in quantity of signal of the data "1"/"0" is set large. Accordingly, at the time of power-on, the tuning information can be correctly read.

It is to be noted that the information storage portion 16 depicted in FIGS. 1 and 2, and the storage elements M1 and bM1 in FIG. 3 in particular can be arranged in an arbitrary area in the memory chip. Furthermore, dummy storage elements equal to the storage elements M1 and bM1 may be arranged around the storage elements M1 and bM1 in order to suppress irregularities in shape of the storage elements M1 and bM1.

2. Second Embodiment

Figure 8:
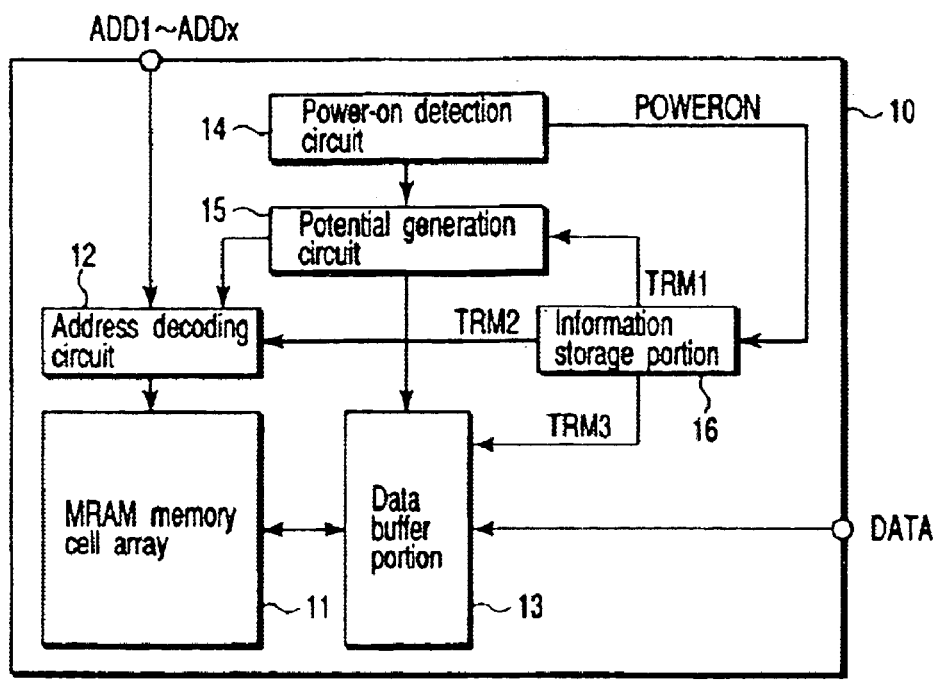

FIG. 8 is a block diagram showing a primary part of a magnetic random access memory according to a second embodiment of the present invention.

As compared with the magnetic random access memory shown in FIG. 1, the magnetic random access memory in this example has a characteristic in a detection signal POWERON outputted by the power-on detection circuit 14 and a circuit configuration of the information storage portion 16.

In the memory chip 10 are arranged, an MRAM memory cell array 11 having magneto-resistive effect elements as memory cells, an address decoding portion 12, a data buffer portion 13, a power-on detection circuit 14, a potential generation circuit 15 and an information storage portion 16.

The address decoding portion 12 has a function to randomly access a memory cell in the memory cell array 11 based on address signals ADD1 to ADDX upon receiving the address signals ADD1 to ADDX. The address decoding portion 12 includes a driver/sinker for driving a write/read word line in, e.g., the write/read operation.

The data buffer portion 13 has a function to determine a direction of a write current which is to be passed to a write bit line based on write data DATA upon receiving the write data DATA in, e.g., the write operation. The data buffer portion 13 includes a driver/sinker for driving the write bit line in the write operation.

Furthermore, the data buffer portion 13 has a function to sense and amplify read data DATA from the memory cell array 11 and output the read data DATA to the outside of the memory chip 10 in, e.g., the read operation. The data buffer portion 13 includes a sense amplifier which senses and amplifies the read data DATA in the read operation.

The power-on detection circuit 14 has a function to detect that the power supply is turned on in a system including the memory chip 10 and an external power supply potential Vcc is supplied to the memory chip 10. That is, the power-on detection circuit 14 outputs a detection signal to the potential generation circuit 15 and also outputs a detection signal POWERON to the information storage portion 16 when it detects the external power supply potential Vcc.

Upon receiving the detection signal, the potential generation circuit 15 generates an internal power supply potential (DC potential) Vdd. The internal power supply potential Vdd is supplied to, e.g., the address decoding portion 12 and the data buffer portion 13.

The information storage portion 16 has a storage element which stores trimming information for adjusting an operation characteristic of the memory circuit, redundancy information for substituting a defective cell by a redundant cell, ID information of the magnetic random access memory and others. As in the first embodiment, the storage element is constituted by a magneto-resistive effect element, namely, an element whose resistance value varies in accordance with a direction of magnetization of the magnetic layer (a TMR element, a GMR element or the like).

The storage element may have the structure and the size which are substantially equal to those of the memory cell in the memory cell array 1, or only the structure of the storage element may be equal to that of the memory cell and the size of the same may be set larger in order to suppress irregularities in the operation characteristic caused due to irregularities in shape in processing.

When the power supply is turned on and the information storage portion 16 receives the detection signal POWERON outputted from the power-on detection circuit 14, the information storage portion 16 supplies the trimming signals TRM1, TRM2 and TRM3 stored in the storage element to the internal circuit in the memory chip 10.

In this example, the trimming signal TRM1 is supplied to the potential generation circuit 15. The trimming signal TRM1 is, e.g., a signal for adjusting a value of the internal power supply potential Vdd in accordance with the operation characteristic of the internal circuit, and the potential generation circuit 15 determines a value of the internal power supply potential Vdd based on the trimming signal TRM1.

The trimming signal TRM2 is supplied to the address decoding portion 12. The trimming signal TRM2 is, e.g., a signal for adjusting a value of a write word line current and a supply/cutoff timing in accordance with the operation characteristic of the internal circuit, and the address decoding portion 12 determines a value of the write word line current and a supply/cutoff timing based on the trimming signal TRM2.

The trimming signal TRM3 is supplied to the data buffer portion 13. The trimming signal TRM3 is, e.g., a signal for adjusting a value of a write bit line current and a supply/cutoff timing in accordance with the operation characteristic of the internal circuit, and the data buffer portion 13 determines a value of the write bit line current and a supply/cutoff timing based on the trimming signal TRM3.

It is to be noted that a structural example of the information storage portion 16 is as shown in FIG. 2, as in the first embodiment.

Figure 9:
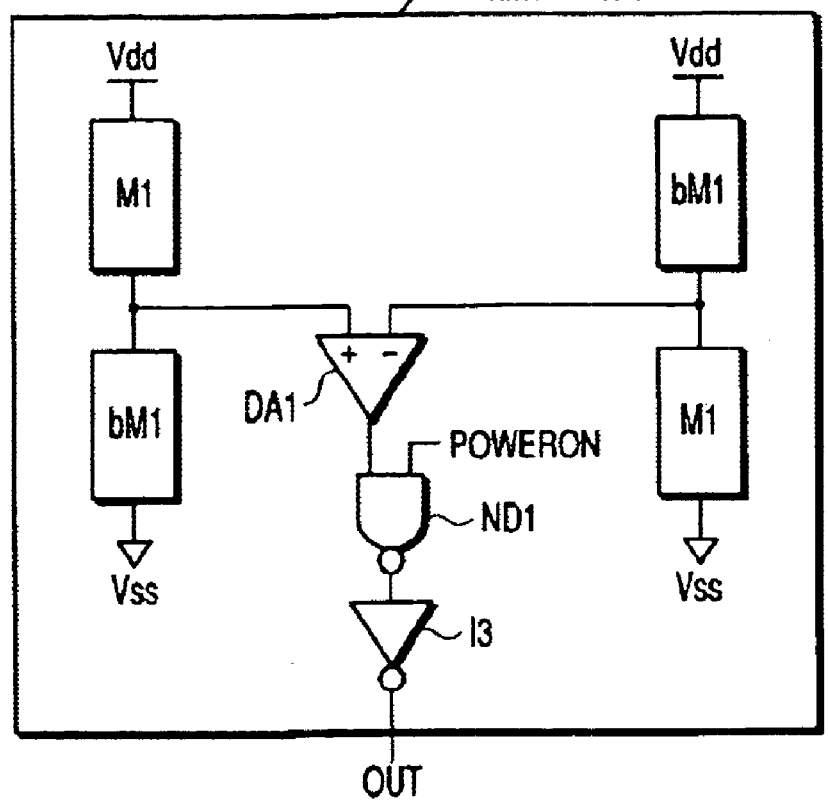
FIG. 9 is a view showing a circuit example of the magnetic element & latch circuit illustrated in FIG. 2.
Figure 10:
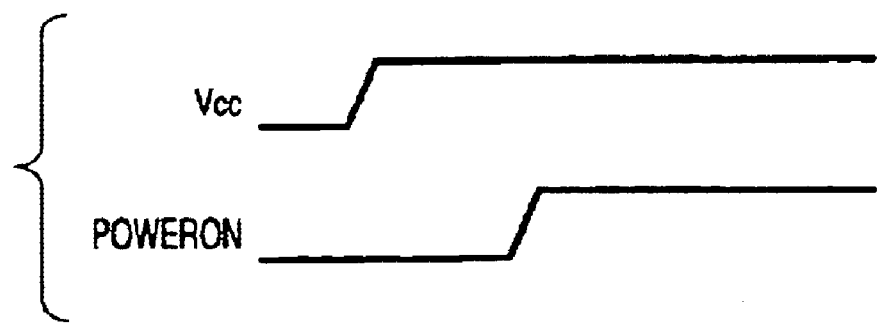
FIG. 10 is a waveform chart showing operation waveforms of the magnetic element & latch circuit depicted in FIG. 9.

FIG. 9 shows a circuit example of the magnetic element & latch circuit n illustrated in FIG. 2. FIG. 10 shows waveforms of the power supply potential Vcc and the detection signal POWERON.

Reference characters M1 and bM1 denote magneto-resistive effect elements (TMR elements, GMR elements or the like) whose resistance value varies depending on a direction of magnetization of the magnetic layer. In this example, one-bit data is stored in one magnetic element & latch circuit. That is, the one-bit data is stored by using four magneto-resistive effect elements M1 and bM1.

In this manner, the one-bit data is stored by using four storage elements in order to correctly and assuredly read the tuning information by acquiring a quantity of signal larger than that of the memory cell in the memory cell array which stores the one-bit data by using one storage element.

It is to be noted that the size of each of the magneto-resistive effect elements (storage elements) M1 and bM1 can be set larger than that of the memory cell in the memory cell array.

Each of the magneto-resistive effect elements M1 and bM1 has such a structure as shown in FIG. 4, for example. Further, as shown in FIG. 5, the resistance value becomes R−ΔR when the directions of magnetization of the two magnetic layers of the magneto-resistive effect element are equal to each other (parallel), and the resistance value becomes R+ΔR when the directions of magnetization of the two magnetic layers of the magneto-resistive effect element are opposite to each other (anti-parallel).

In case of this example, the one-bit data is stored by setting the magnetization states of the magneto-resistive effect elements M1 and bM1 to be different from each other.

For example, when programming data "1" in the magnetization element & latch circuit n, the magnetization state of the magneto-resistive effect element M1 is set parallel (resistance value: R−ΔR), and the magnetization state of the magneto-resistive effect element bM1 is set anti-parallel (resistance value: R+ΔR). When programming data "0" in the magnetic element & latch circuit n, the magnetization state of the magneto-resistive effect element M1 is set anti-parallel (resistance value: R+ΔR), and the magnetization state of the magneto-resistive effect element bM1 is set parallel (resistance value: R−ΔR).

It is to be noted that each of the magneto-resistive effect elements M1 and bM1 may be constituted by a series resistor in which m (m is a number not less than 1) storage elements shown in FIG. 4 are connected in series; for example.

A differential amplifier DA1 outputs "H" when a potential of a plus side input node is larger than a potential of a minus side input node, and outputs "L" when a potential of the minus side input node is larger than a potential of the plus side input node. An output node of the differential amplifier DA1 is connected to one of the two input nodes of an NAND gate circuit ND1. The detection signal POWERON is inputted to one of the two input nodes of the NAND gate circuit ND1.

The detection signal POWERON is a signal which becomes "H" when the power-on detection circuit detects that the power supply has been turned on. The NAND gate circuit ND1 outputs an output signal of the differential amplifier DA1 as an output signal OUT (trimming signal TRMi) only when the detection signal POWERON is "H".

As described thus far, according to the second embodiment of the present invention, the magneto-resistive effect element whose resistance value varies in accordance with a direction of magnetization of the magnetic layer is used in order to program the tuning information. Therefore, the tuning information can be repeatedly written after packaging.

Furthermore, the magneto-resistive effect element which stores the tuning information is set to a size which is not affected by irregularities of the shape, namely a size required for correctly and assuredly reading data, e.g., a size larger than that of the memory cell. Moreover, the one-bit data is stored by using four magneto-resistive effect element, and a difference in quantity of signal of the data "1"/"0" is set large. Therefore, the tuning information can be correctly read at the time of power-on.

It is to be noted that the information storage portion 16 shown in FIG. 8, and the storage elements M1 and bM1 depicted in FIG. 9 in particular can be arranged in an arbitrary area in the memory chip. Moreover, dummy storage elements equal to the storage elements M1 and bM1 may be arranged around the storage elements M1 and bM1 in order to suppress irregularities of the shapes of the storage elements M1 and bM1.

3. Third Embodiment

Figure 11:
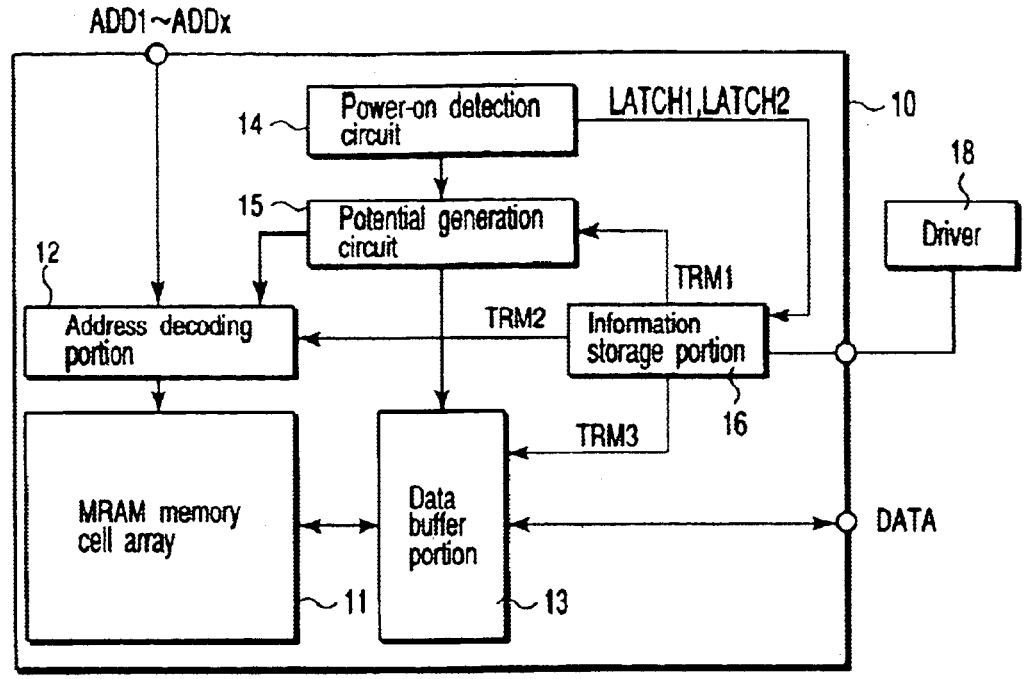
FIG. 11 is a block diagram showing a primary part of a magnetic random access memory according to a third embodiment of the present invention.
Figure 12:
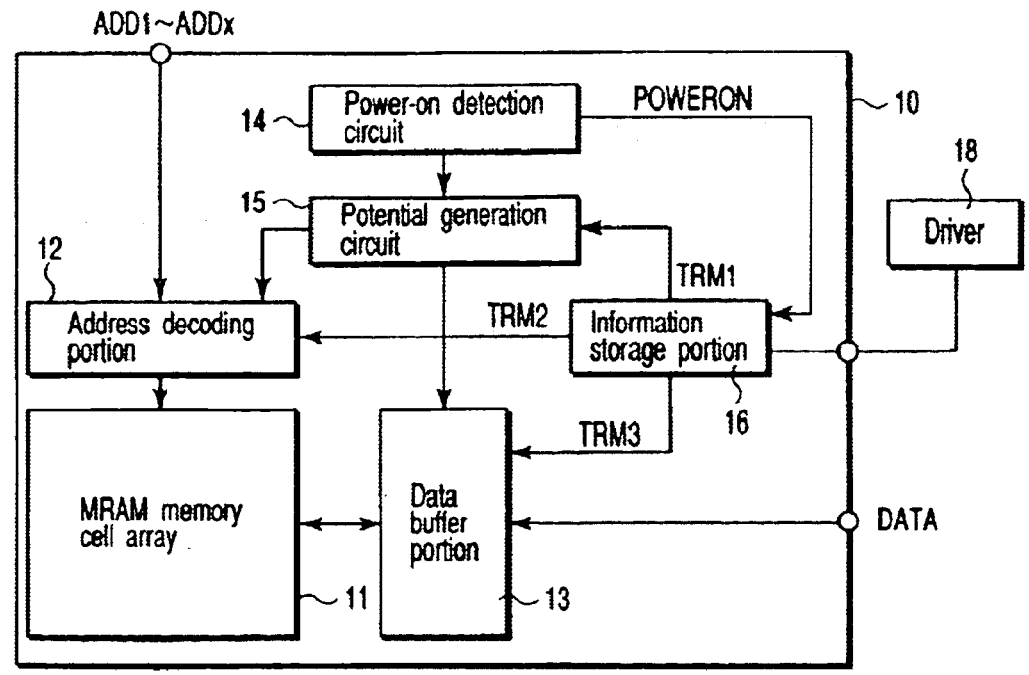
FIG. 12 is a block diagram showing the primary part of the magnetic random access memory according to the third embodiment of the present invention.

FIGS. 11 and 12 are block diagrams showing primary part of a magnetic random access memory according to a third embodiment of the present invention.

The magnetic random access memory of this example proposes a programming technique with respect to the storage element in the information storage portion 16 in the magnetic random access memories according to the first and second embodiments.

In the first and second embodiments, the storage element in the information storage portion 16 stores data therein in accordance with the fact that the magnetization state of the storage elements is parallel or anti-parallel, like the memory cell in the magnetic random access memory, for example. In this case, programming with respect to the storage element in the information storage portion 16 is carried out as in the case of programming with respect to the memory cell.

Therefore, two write lines which cross each other must be arranged in the vicinity of the storage element in the information storage portion, and the write current must be caused to flow through the two write lines in the write operation.

Thus, in this example, a programming terminal for the trimming information is provided to the memory chip 10, and the write current is supplied to the write lines in the information storage portion 16 from the driver 18 provided outside the memory chip 10 through the programming terminal.

It is to be noted that the driver 18 is provided outside the memory chip 10 because providing the driver 18 to the outside of the memory chip 10 without using the programming terminal is advantageous for preventing an area of the memory chip 10 from being increased However, if the driver 18 can be provided inside the memory chip 10, the driver 18 may he provided within the memory chip 10.

4. Fourth Embodiment

Figure 13:
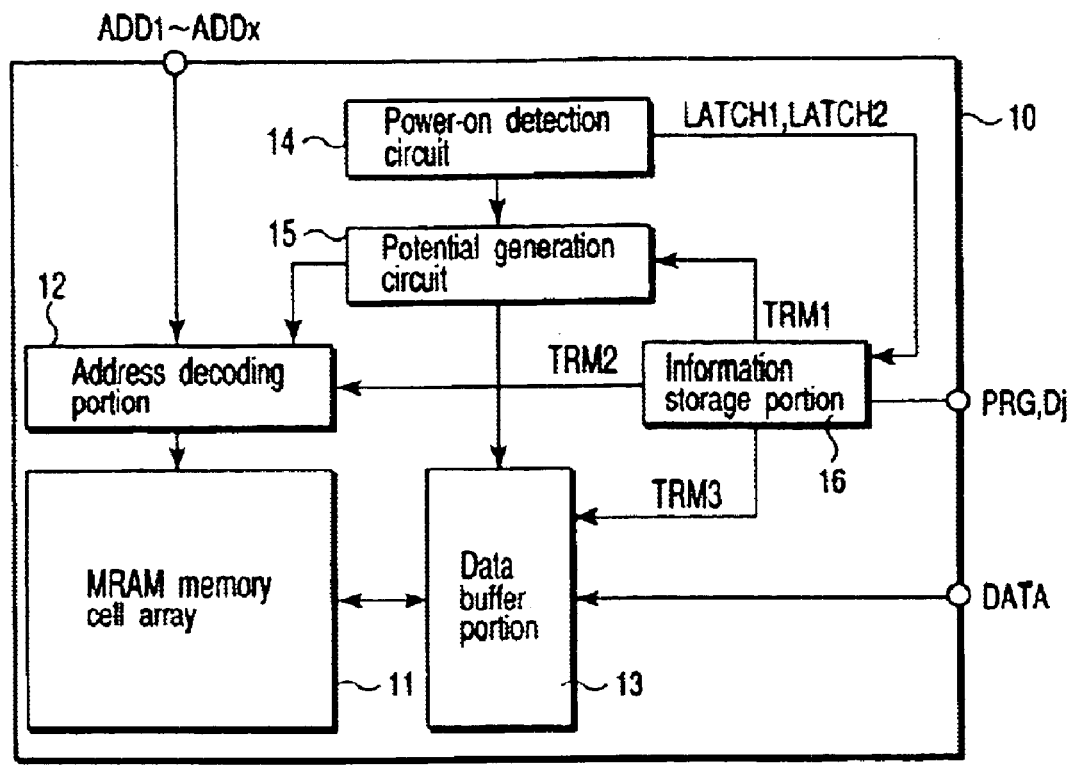
FIG. 13 is a block diagram showing a primary part of the magnetic random access memory according to a fourth embodiment of the present invention.

FIG. 13 is a block diagram showing a primary part of a magnetic random access memory according to a fourth embodiment of the present invention.

The magnetic random access memory according to this example has a characteristic in the circuit configuration of the information storage portion 16 as compared with the magnetic random access memories according to the first and second embodiments mentioned above.

In the magnetic random access memories according to the first and second embodiments, programming with respect to the storage element in the information storage portion 16 is carried out by the same technique as programming with respect to the memory cell.

On the other hand, in this example, programming with respect to the storage element in the information storage portion 16 is executed in accordance with the fact that the tunneling barrier of the storage element having such a structure as shown in FIG. 4 is destroyed or not, for example.

In case of using this technique, although the tuning information can not be repeatedly written, the aim to correctly read the tuning information can be attained at the time of power-on. In addition, there is an advantage that the circuit for programming with respect to the storage element in the information storage portion 16 can be simplified.

In the memory chip 10 are arranged an MRAM memory cell array 11 having a magneto-resistive effect element as a memory cell, an address decoding portion 12, a data buffer portion 13, a power-on detection circuit 14, a potential generation circuit 15 and an information storage portion 16.

The address decoding portion 12 has a function to randomly access a memory cell in the memory cell array 11 based on address signals ADD1 to ADDx upon receiving the address signals ADD1 to ADDx. The address decoding portion 12 includes a driver/sinker for driving a write/read word line in the write/read operation, for example.

The data buffer portion 13 has a function to determine a direction of a write current to be passed to a write bit line based on write data DATA upon receiving the write data DATA in the write operation, for example. The data buffer portion 13 includes a driver/sinker for driving the write bit line in the write operation.

Additionally, the data buffer portion 13 has a function to sense and amplify read data DATA from the memory cell array 11 and output the read data DATA to the outside of the memory chip 10 in the read operation, for example. The data buffer portion 13 includes a sense amplifier for sensing and amplifying the read data DATA in the read operation.

The power-on detection circuit 14 has a function to detect that the power supply is turned on in a system including the memory chip 10 and an external power supply potential Vcc is supplied to the memory chip 10. That is, upon detecting the external power supply potential Vcc, the power-on detection circuit 14 outputs a detection signal to the potential generation circuit 15 and also outputs latch signals LATCH1 and LATCH2 to the information storage portion 16.

Upon receiving the detection signal, the potential generation circuit 15 generates an internal power supply potential (DC potential) Vdd. The internal power supply potential Vdd is supplied to the address decoding portion 12 and the data buffer portion 13, for example.

The information storage portion 16 has a storage element which stores trimming information for adjusting an operation characteristic of the internal circuit, redundancy information for substituting a defective cell by a redundant cell, ID information of the magnetic random access memory or the like. The storage element is constituted by a magneto-resistive effect element, namely, an element whose resistance value varies in accordance with a direction of magnetization of the magnetic layer (a TMR element, a GMR element or the like), as in the first embodiment.

The storage element may have the structure and the size which are substantially equal to those of the memory cell in the memory cell array 11, or only the structure of the storage element may be equal to that of the memory cell and the size of the same may be set larger in order to suppress irregularities in the operation characteristic caused due to irregularities in shape in processing.

Programming with respect to the storage element in the information storage portion 16 is executed by giving a program signal PRG and program data Dj to the information storage portion 16 through a programming terminal.

On the other hand, in the regular operation, upon receiving the latch signals LATCH1 and LATCH2 outputted from the power-on detection circuit 14, the information storage portion 16 supplies the trimming signals TRM1, TRM2 and TRM3 stored in the storage element to the internal circuit in the memory chip 10.

In this example, the trimming signal TRM1 is supplied to the potential generation circuit 15, the trimming signal TRM2 is supplied to the address decoding portion 12, and the trimming signal TRM3 is supplied to the data buffer portion 13.

Figure 14:
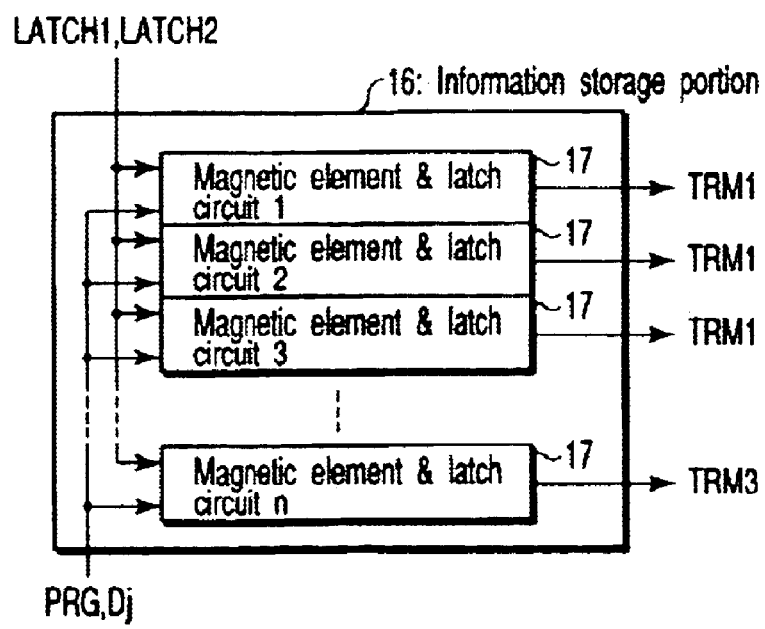
FIG. 14 is a view showing a structural example of an information storage portion depicted in FIG. 13.

FIG. 14 shows a structural example of the information storage portion 16. FIG. 15 shows a circuit example of the magnetic element & latch circuit n depicted in FIG. 14.

The information storage portion 16 is constituted by a plurality of magnetic elements & latch circuits 1, 2, 3, . . . n. The magnetic elements & latch circuits 1, 2, 3, . . . n have substantially the same circuit configuration.

It is to be noted that the trimming signals TRM1, TRM2 and TRM3 may be generated by one magnetic element & latch circuit, or it may be generated by two or more magnetic elements & latch circuits.

The magneto-resistive effect element M1 has a function as an anti-fuse which stores data therein depending on whether the tunneling barrier is to be destroyed.

The program signal PRG and the program data DJ are inputted to an NAND gate circuit ND2. An output node of the NAND gate circuit ND2 is connected to a gate of a P channel MOS transistor P2. A source of the P channel MOS transistor P2 is connected to an internal power supply terminal Vdd, and a drain of the same is connected to one end of the magneto-resistive effect element M1.

A P channel MOS transistor P1 having a ground potential Vss given to the gate thereof and an N channel MOS transistor N1 having a clamp potential Vclamp given to the gate thereof are connected in series between the internal power supply terminal Vdd and one end of the magneto-resistive effect element M1. An N channel MOS transistor N2 having an internal power supply potential Vdd given to the gate thereof is connected between the other end of the magneto-resistive effect element M1 and the ground terminal Vss.

The latch circuit is constituted by an inverter I1 and a clocked inverter CI1 which are flip-flop-connected.

An N channel MOS transistor NT1 is connected between a connection node n2 of the MOS transistors P1 and N1 and an input node of the latch circuit. An inverter I2 is connected to an output node of the latch circuit. An output signal OUT from the inverter I2 becomes a trimming signal TRMi.

In such a magnetic element & latch circuit n, programming with respect to the magneto-resistive effect element M1 is carried out as follows.

At first, the program signal PRG is set "H". When the program signal PRG becomes "H", the P channel MOS transistor P2 enters the on/off state in accordance with a value of the program data Dj.

For example, when the program data Dj is "1" (="H"), an output from the NAND gate circuit ND2 becomes "L", and the P channel MOS transistor P2 enters the on state. Therefore, a high voltage is applied to both ends of the magneto-resistive effect element M1, and the tunneling barrier of the magneto-resistive effect element M1 is destroyed.

Further, when the program data DJ is "0" (="L"), an output from the NAND gate circuit ND2 becomes "H", and the P channel MOS transistor P2 enters the off state. Therefore, a high voltage is not applied to both ends of the magneto-resistive effect element M1, and the tunneling barrier of the magneto-resistive effect element M1 is not destroyed.

As described above, according to the fourth embodiment of the present invention, the magneto-resistive effect element which stores data therein depending on whether the tunneling barrier is to be destroyed is used in order to program the tuning information. Furthermore, the magneto-resistive effect element which stores the turning information is set to a size larger than that of the memory cell, for example. Therefore, the tuning information can be correctly read at the time of power-on.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A magnetic random access memory comprising:
   a memory cell array determining a first element having a magnetic layer as a memory cell;
   an internal circuit which controls a memory operation including a data write/read operation with respect to said memory cell; and
   an information storage portion which is provided separately from said memory cell array and stores, in a non-volatile manner, information which determines an operation characteristic of said internal circuit based on a test result of said internal circuit,
   wherein said information storage portion uses a second element having said magnetic layer as a storage element to store said information.

2. The magnetic random access memory according to claim 1, wherein said first and second elements have structures which are substantially equal to each other and sizes different from each other.

3. The magnetic random access memory according to claim 2, wherein said size of said second element is larger than that of said first element.

4. The magnetic random access memory according to claim 1, wherein each of said first and second elements is constituted by one of a TMR element or a GMR element.

5. The magnetic random access memory according to claim 1, wherein said first element stores data by utilizing a change in resistance value according to a direction of magnetization of said magnetic layer.

6. The magnetic random access memory according to claim 1, wherein said second element stores said information by utilizing a change in resistance value according to a direction of magnetization of said magnetic layer.

7. The magnetic random access memory according to claim 1, wherein said second element has a tunneling barrier and stores said information by utilizing presence/absence of destruction of said tunneling barrier.

8. The magnetic random access memory according to claim 1, wherein said information storage portion has a third element having said magnetic layer and stores one-bit data by using at least said second and third elements.

9. The magnetic random access memory according to claim 1, wherein said information storage portion stores trimming information concerning an operation characteristic of a memory chip.

10. The magnetic random access memory according to claim 1, wherein said information storage portion stores redundancy information concerning remedy of a defective bit in said memory cell array.

11. The magnetic random access memory according to claim 1, wherein said information storage portion stores ID information of said memory chip.

12. The magnetic random access memory according to claim 1, wherein said information storage portion has a latch circuit constituted by a semiconductor element, and said information is latched to said latch circuit after turning on a power supply and supplied to said internal circuit.

13. The magnetic random access memory according to claim 1, wherein said information storage portion has a logic circuit constituted by a semiconductor element, and said information is supplied to said internal circuit through said logic circuit after turning on said power supply.

14. The magnetic random access memory according to claim 1, wherein programming with respect to said second element is executed by using a driver provided to outside of said memory chip.

15. The magnetic random access memory according to claim 14, wherein said driver generates a write current which generates a magnetic field for said programming.

* * * * *